US010076060B2

(12) United States Patent
Cacho Alonso et al.

(10) Patent No.: US 10,076,060 B2
(45) Date of Patent: Sep. 11, 2018

(54) COOLING DEVICE, IN PARTICULAR FOR COOLING COMPONENTS HOUSED IN A SWITCHGEAR CABINET, CORRESPONDING USE AND CORRESPONDING METHOD

(71) Applicant: RITTAL GMBH & CO. KG, Herborn (DE)

(72) Inventors: Juan Carlos Cacho Alonso, Herborn (DE); Thorsten Heimberg, Schöffengrund (DE); Jörg Knetsch, Ehringshausen (DE); Daniel Rosenthal, Siegen (DE)

(73) Assignee: RITTAL GMBH & CO. KG (DE)

( * ) Notice: Subject to any disclaimer, the term of this patent is extended or adjusted under 35 U.S.C. 154(b) by 0 days.

(21) Appl. No.: 15/314,715

(22) PCT Filed: Jun. 5, 2015

(86) PCT No.: PCT/DE2015/100226
§ 371 (c)(1),
(2) Date: Nov. 29, 2016

(87) PCT Pub. No.: WO2015/185040
PCT Pub. Date: Dec. 10, 2015

(65) Prior Publication Data
US 2017/0202109 A1    Jul. 13, 2017

(30) Foreign Application Priority Data
Jun. 5, 2014    (DE) .................. 10 2014 107 931

(51) Int. Cl.
*H05K 7/20*    (2006.01)
*H02P 27/06*    (2006.01)
(Continued)

(52) U.S. Cl.
CPC ......... *H05K 7/20318* (2013.01); *F25B 31/02* (2013.01); *H02P 6/04* (2013.01);
(Continued)

(58) Field of Classification Search
CPC .. H02M 7/003; H02M 7/537; H05K 7/20318; H05K 7/20909; H05K 7/20936;
(Continued)

(56) References Cited

U.S. PATENT DOCUMENTS 6,345,512 B1    2/2002  Cosley et al.
8,297,068 B2 *  10/2012 Yokouchi ............. F04D 27/004
                                                              62/239
(Continued)

FOREIGN PATENT DOCUMENTS

JP    H01197110 A    8/1989

OTHER PUBLICATIONS

International Search Report (in English and German) and Written Opinion (in German) for PCT/DE2015/100226, dated Oct. 27, 2015; ISA/EP.
(Continued)

*Primary Examiner* — Matthew Nguyen
(74) *Attorney, Agent, or Firm* — Harness, Dickey & Pierce, P.L.C.

(57) ABSTRACT

The disclosure relates to a cooling device, in particular for cooling components that are housed in a switchgear cabinet, comprising a first cooling fan for blowing air from the switchgear cabinet through a first heat exchanger, and a second cooling fan for blowing ambient air through a second heat exchanger, characterized in that the cooling device further comprises a voltage supply having a step-up and/or step-down converter, which is connected via a rectifier to a wide-range input for single-phase or multiphase AC voltage, and which charges a capacitor to a DC link voltage which is
(Continued)

higher or lower than a mains voltage across the wide-range input, a power supply unit of at least one of the two cooling fans being connected in parallel to the capacitor. The disclosure further relates to the use of such a cooling device and to a corresponding method for operating the cooling device.

9 Claims, 1 Drawing Sheet

(51) Int. Cl.
*H02P 6/04* (2016.01)
*F25B 31/02* (2006.01)
*F04B 35/04* (2006.01)
*F04C 29/00* (2006.01)
*F04D 25/06* (2006.01)
*H02M 7/00* (2006.01)

(52) U.S. Cl.
CPC ......... *H02P 27/06* (2013.01); *H05K 7/20909* (2013.01); *H05K 7/20936* (2013.01); *F04B 35/04* (2013.01); *F04C 29/0085* (2013.01); *F04D 25/06* (2013.01); *H02M 7/003* (2013.01)

(58) Field of Classification Search
CPC .. H02P 27/06; H02P 6/04; F04B 35/04; F04C 29/0085; F04D 25/06
See application file for complete search history.

(56) References Cited

U.S. PATENT DOCUMENTS

| 9,867,314 B2* | 1/2018 | Lim | H05K 7/20209 |
| 2004/0007347 A1 | 1/2004 | Stoller | |
| 2013/0104592 A1* | 5/2013 | Cottet | H05K 7/20672 |
| | | | 62/419 |
| 2014/0301041 A1* | 10/2014 | Kitanaka | H02M 7/003 |
| | | | 361/697 |
| 2017/0244275 A1* | 8/2017 | Kobayashi | H02J 7/0068 |

OTHER PUBLICATIONS

International Preliminary Report on Patentability (Chapter II) (in German) for PCT/DE2015/100226, dated May 4, 2016; IPEA/EP.

* cited by examiner

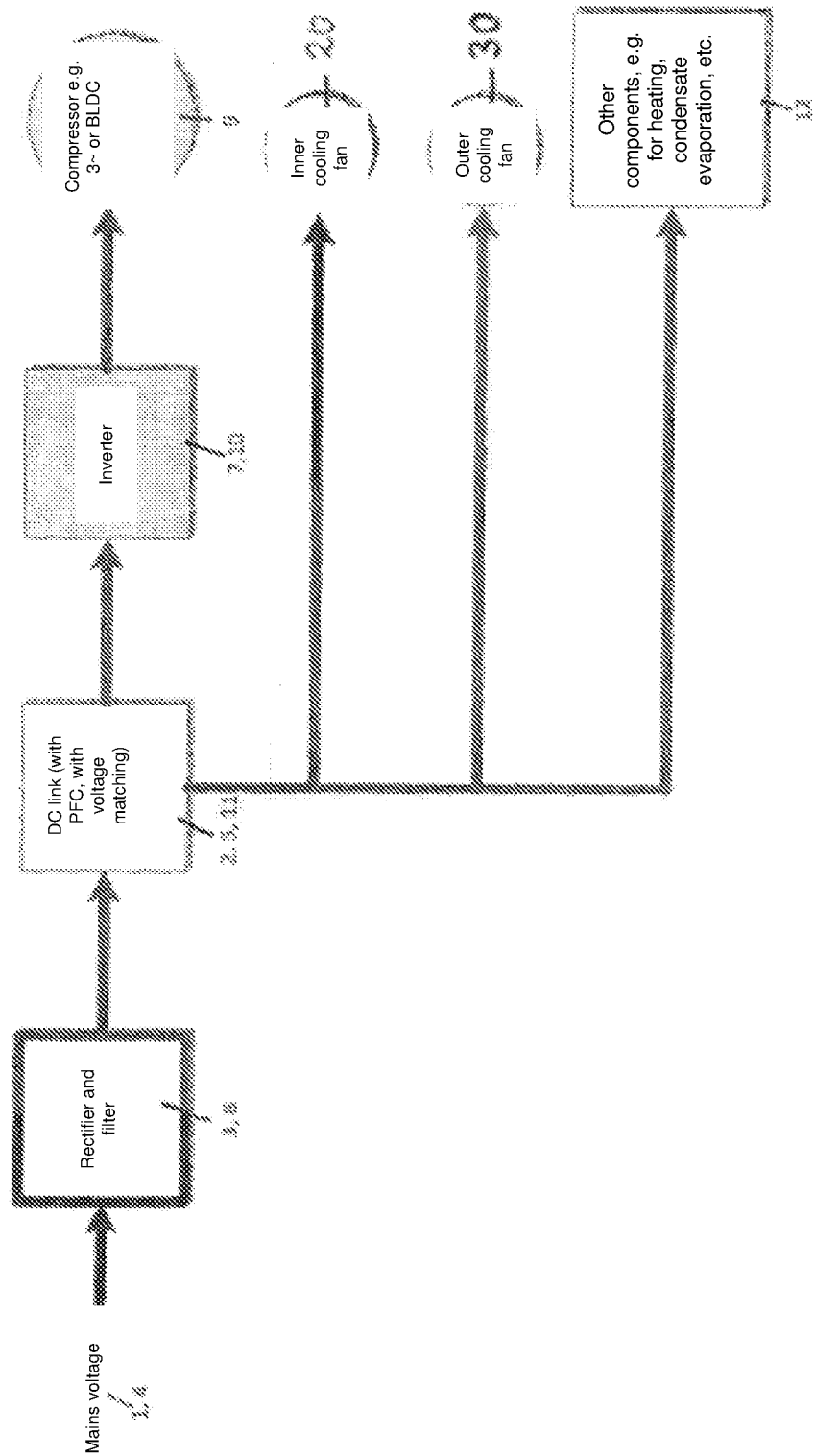

COOLING DEVICE, IN PARTICULAR FOR COOLING COMPONENTS HOUSED IN A SWITCHGEAR CABINET, CORRESPONDING USE AND CORRESPONDING METHOD

CROSS-REFERENCE TO RELATED APPLICATIONS

This application is a 371 U.S. National Stage of International Application No. PCT/DE2015/100226, filed on Jun. 5, 2015, which claims priority to German Application No. 10 2014 107 931.0, filed on Jun. 5, 2014. The entire disclosures of the above applications are incorporated herein by reference.

FIELD

The disclosure relates to a cooling device, in particular for cooling components that are housed in a switchgear cabinet, and to a corresponding use and a corresponding method. A generic cooling device comprises a first cooling fan for blowing air from the switchgear cabinet through a first heat exchanger, and a second cooling fan for blowing ambient air through a second heat exchanger.

BACKGROUND

This section provides background information related to the present disclosure which is not necessarily prior art.

The prior art contains known cooling devices of this type in which the electrical components are adapted, in terms of the voltage they require to operate, to the electric mains voltages predominating in the geographic region where the cooling device will be used. Thus it is customary, for example, for a variant of each power stage of a cooling device to be offered for each of the mains voltages 115 V, 230 V and 400 V, to enable the cooling device to be marketed worldwide wherever possible. In addition to the above, various special voltages must also be considered.

The prior art therefore contains known cooling devices in which, depending on the anticipated mains voltage, for example, a suitable transformer having a primary input of 115 V, 200 V, 230 V, 400 V or 460 V is used, which then supplies a secondary output voltage of 230 V, 400 V or 460 V, depending on the primary input voltage, at various power levels. Depending on the secondary output voltage of the transformer, the cooling device has a controller which operates at the secondary output voltage of the transformer and uses corresponding voltages to control the controllable electrical components of the cooling device, in particular the cooling fans, and, if present, a compressor, the sensor system or an expansion valve. This in turn requires these cooling device components that are controlled by the controller to also be supplied in 150 V, 200 V, 230 V, 400 V or 460 V variants, depending on the geographic region where the cooling device will be used and the predominant mains voltage supplied there. In still other prior art cooling devices, the active cooling device components are powered by an adapted voltage via a transformer.

SUMMARY

This section provides a general summary of the disclosure, and is not a comprehensive disclosure of its full scope or all of its features.

It is therefore the object of the disclosure to propose a generic cooling device in which a single variant is sufficient for operating with different input AC voltages.

The cooling device according to the disclosure is characterized in that it further comprises a voltage supply with a step-up and/or step-down converter, which is connected via a rectifier to a wide-range input for single-phase or multi-phase AC voltage, and which charges a capacitor to a DC link voltage which is higher or lower than a mains voltage across the wide-range input, a power supply unit of at least one of the two cooling fans being connected in parallel to the capacitor.

In a simplest embodiment, each of the first and second heat exchangers of the cooling device is an air/coolant heat exchanger, through which a liquid coolant is circulated by means of a pump. Alternatively, the cooling device may comprise a compressor-driven cooling circuit, in which case it further comprises a compressor and a choking element, for example, an expansion valve. In this embodiment, the cooling device may comprise a three-phase inverter, which is connected in parallel to the capacitor and supplies a three-phase current to the compressor. The device may also be a re-cooling device, for example a chiller.

The voltage supply for condensate management in the cooling device may particularly preferably comprise a heating element terminal for an electric heating element which is controlled via a controller, said terminal being connected in parallel to the capacitor. Thus in the cooling device according to the disclosure, such a heating element may also be formed as a single-voltage device that does not itself require multi-voltage capability.

The disclosure is therefore based on the concept of designing active components of the cooling device, in particular the cooling fans, as direct current devices, and converting any input AC voltages (single-phase or three-phase, 100 V-460 V, 50 Hz or 60 Hz) to a DC voltage suitable for operating these active cooling device components. A three-phase current that may be required for a compressor or the like is supplied by a three-phase inverter and is converted from the DC link voltage. Thus with the cooling device according to the disclosure it is no longer necessary to provide multiple variants in which the operating voltages of the active components of the cooling device are adapted to the mains voltage or to a voltage to which the mains voltage can be transformed.

In one embodiment of the disclosure, the cooling device has a mains filter for increasing interference immunity and decreasing interference output, the mains filter being connected to at least one outer conductor, one grounding conductor and optionally one neutral conductor of the wide-range input, and the grounding conductor leading from the wide-range input through the mains filter and from there directly to a three-phase output, to which the three-phase current for the compressor is supplied.

To vary the cooling power of a compressor-driven cooling device, in one embodiment of the disclosure it is provided that the three-phase inverter is controlled by an inverter controller such that the three-phase current is supplied by the three-phase inverter at the three-phase power necessary to achieve a given compressor output level.

In yet another embodiment, the step-up and/or step-down converter is controlled via a converter controller in such a way that the step-up and/or step-down converter charges the capacitor to a DC link voltage, the dimensions of which are such that the power supply voltage required to operate the first or the second cooling fan is supplied via the power supply unit. The wide-range input for single-phase or three-phase AC voltage is preferably designed at least for input voltages of between 110 V and 240 V and/or between 380 and 460V.

In yet another embodiment, the compressor and/or the cooling fans have BLDC motors.

According to another aspect, the disclosure relates to the use of a cooling device of the type described above in order to charge the capacitor via the step-up converter, irrespective of a single-phase or multiphase input AC voltage across the wide-range input, to a DC link voltage, the dimensions of which are such that the power supply voltage required to achieve a given cooling fan power of the first and/or second cooling fan is supplied via the power supply unit.

According to another aspect of the disclosure, in a cooling device having a compressor-driven cooling circuit, in order to operate the compressor at the nominal three-phase voltage necessary to achieve a required compressor output level, irrespective of a single-phase or multiphase input AC voltage across the wide-range input, the use of a cooling device of the type described above is proposed in which, for varying the output of the compressor, the three-phase inverter is designed to raise or lower a nominal three-phase voltage based on the compressor output level that is required.

According to yet another aspect, the disclosure relates to a method for operating a cooling device of the type described above, the method comprising the following steps:
    rectifying and raising and/or lowering a single-phase or multiphase input AC voltage between 110 V and 460 V to a constant DC link voltage and supplying the DC link voltage to a power supply unit of the cooling fan or cooling fans, the dimensions of the DC link voltage being such that the power supply unit is able to supply the power supply voltage required to operate the first and/or second cooling fan.

In one embodiment, the method further comprises the following steps:
    feeding the DC link voltage to the three-phase inverter;
    determining the required compressor output level; and
    adjusting the compressor-based nominal three-phase voltage that has been converted by the three-phase inverter until the required compressor output level is achieved.

DRAWINGS

The drawings described herein are for illustrative purposes only of selected embodiments and not all possible implementations, and are not intended to limit the scope of the present disclosure.

Details of the disclosure will be explained below with reference to the preferred embodiment depicted in the following FIGURE in the form of a block diagram.

DETAILED DESCRIPTION

Example embodiments will now be described more fully with reference to the accompanying drawings.

For purposes of simplification, the FIGURE shows only a block diagram of the voltage supply 1 for the cooling device according to the disclosure. Voltage supply 1 has a wide-range input 4 for an up to three-phase AC voltage or a DC voltage. A grounding conductor terminal may also be provided. To increase interference immunity and decrease interference output, wide-range input 4 is connected to a mains filter 8. Mains filter 8 has a three-phase output, which is connected to an input of a rectifier 3 designed as a rectifier bridge. Rectifier 3 generates a DC voltage which is fed to the step-up and/or step-down converter 2. From the DC voltage that is supplied via rectifier 3, step-up and/or step-down converter 2 generates a constant DC link voltage of 380 V, for example, which is higher or lower than the voltage supplied by the rectifier depending on the output voltage, and charges a capacitor 5 with said DC link voltage. The DC link voltage is fed to a power supply unit for the cooling fans 20, 30, which is connected in parallel to capacitor 5. Step-up and/or step-down converter 2 is preferably a combined step-up and step-down converter.

Step-up and/or step-down converter 2 is controlled by a converter controller 11, with controller 11 being designed to control step-up and/or step-down converter 2 so as to charge capacitor 5 with a constant electrical voltage, irrespective of the voltage across the wide-range input 4.

The DC link voltage is fed to a three-phase inverter 7, which is controlled by an inverter controller 10. Inverter controller 10 is designed to control three-phase inverter 7 such that three-phase inverter 7 supplies the three-phase current at the three-phase power necessary to achieve a given compressor output level. The three-phase current generated by three-phase inverter 7 is supplied to compressor 9 via a three-phase output.

For condensate management, voltage supply 1 may further comprise a terminal 12 for a heating element, with the capacitor voltage of 380 V, for example, being applied across terminal 12. The heating element can be controlled via a controller (not shown) for as-needed operation.

The features of the disclosure disclosed in the foregoing description, in the drawings and in the claims may be considered essential both individually and in any combination to the implementation of the disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A cooling device, in particular for cooling components that are housed in a switchgear cabinet, comprising a first cooling fan for blowing air from the switchgear cabinet through a first heat exchanger, and a second cooling fan for blowing ambient air through a second heat exchanger, the cooling device further comprising a compressor-driven cooling circuit having a compressor and a mechanical or electronic choking element, characterized in that the cooling device comprises a voltage supply having a step-up and/or a step-down converter, which is connected via a rectifier to a wide-range input for single-phase or multiphase AC voltage, and which charges a capacitor to a DC link voltage which is higher or lower than a mains voltage across the wide-range input, the capacitor being connected in parallel to a three-phase inverter which supplies three-phase current to the compressor, and a power supply unit of at least one of the two cooling fans being connected in parallel to the capacitor, so that, irrespective of a single-phase or multiphase input AC voltage across the wide-range input, the compressor can be operated on the nominal three-phase voltage that is necessary for a required compressor output level.

2. The cooling device according to claim 1, wherein for condensate management, the voltage supply has a heating element terminal for connecting an electric heating element that is controlled by a controller, said terminal being connected in parallel to the capacitor.

3. The cooling device according to claim 1, wherein a mains filter is connected to at least one outer conductor, one grounding conductor and, if present, one neutral conductor of the wide-range input, the grounding conductor leading from the wide-range input through the mains filter and from there directly to a three-phase outlet, to which the three-phase current for the compressor is supplied.

4. The cooling device according to claim 1, wherein the three-phase inverter is controlled by an inverter controller such that the three-phase current is supplied by the three-phase inverter at the three-phase power required to achieve a given compressor output level.

5. The cooling device according to claim 1, wherein the step-up and/or step-down converter is controlled via a converter controller such that the capacitor is charged via the step-up and/or step-down converter to a DC link voltage, the dimensions of which are such that the power supply voltage required to operate the first and/or second cooling fan is supplied via the power supply unit.

6. The cooling device according to claim 1, wherein the wide-range input for single-phase or three-phase AC voltage is designed at least for input voltages of between 110 V and 240 V and/or between 380 and 460V.

7. The cooling device according to claim 1, wherein the compressor and/or the cooling fans have brushless direct current motors.

8. The use of a cooling device according to claim 1 for operating the compressor on the nominal three-phase voltage necessary for a required compressor output level, irrespective of a single-phase or multiphase input AC voltage across the wide-range input, wherein for varying the output level of the compressor, the three-phase inverter is designed to raise or lower a nominal three-phase voltage based on the compressor output level that is required.

9. The method for operating a cooling device according to claim 1, comprising the following steps:
   rectifying and raising and/or lowering a single-phase or multiphase input AC voltage between 110 V and 460 V to a constant DC link voltage;
   supplying the DC link voltage to a power supply unit (6) of the cooling fan or cooling fans, the dimensions of the DC link voltage being such that the power supply unit is able to supply the power supply voltage required to operate the first and/or second cooling fan;
   feeding the DC link voltage to the three-phase inverter;
   determining the required compressor output level;
   adjusting the compressor-based nominal three-phase voltage that has been converted by the three-phase inverter until the required compressor output level is achieved.

\* \* \* \* \*